United States Patent
Salessi et al.

(10) Patent No.: US 8,843,700 B1
(45) Date of Patent: Sep. 23, 2014

(54) POWER EFFICIENT METHOD FOR COLD STORAGE DATA RETENTION MANAGEMENT

(71) Applicant: NXGN Data, Inc., Irvine, CA (US)

(72) Inventors: Nader Salessi, Laguna Niguel, CA (US); Joao Alcantara, Irvine, CA (US)

(73) Assignee: NXGN Data, Inc., Irvine, CA (US)

( * ) Notice: Subject to any disclaimer, the term of this patent is extended or adjusted under 35 U.S.C. 154(b) by 0 days.

(21) Appl. No.: 14/093,335

(22) Filed: Nov. 29, 2013

(51) Int. Cl.
*G06F 12/00* (2006.01)
*G06F 13/00* (2006.01)
*G06F 13/28* (2006.01)
*G06F 12/02* (2006.01)

(52) U.S. Cl.
CPC .................................. *G06F 12/0246* (2013.01)
USPC .......................................................... 711/103

(58) Field of Classification Search
CPC ....... G06F 1/32; G06F 1/3203; G06F 1/3268; G06F 1/3275; G06F 9/4418
USPC .......................................................... 711/103
See application file for complete search history.

(56) References Cited

U.S. PATENT DOCUMENTS

| | | | |
|---|---|---|---|
| 8,433,937 B1* | 4/2013 | Wheelock et al. | 713/320 |
| 2003/0145167 A1* | 7/2003 | Tomita | 711/114 |
| 2007/0260811 A1* | 11/2007 | Merry et al. | 711/103 |
| 2011/0026062 A1* | 2/2011 | Takatani | 358/1.13 |
| 2011/0185208 A1* | 7/2011 | Iwamoto et al. | 713/323 |
| 2011/0283128 A1* | 11/2011 | Farhan et al. | 713/324 |
| 2011/0314319 A1* | 12/2011 | Kurahashi | 713/340 |
| 2012/0246506 A1* | 9/2012 | Knight | 713/340 |
| 2012/0272024 A1 | 10/2012 | Park et al. | |
| 2012/0294212 A1* | 11/2012 | Meri et al. | 370/311 |
| 2012/0324191 A1 | 12/2012 | Strange et al. | |
| 2013/0080803 A1* | 3/2013 | Ananthakrishnan et al. | 713/320 |
| 2013/0103900 A1* | 4/2013 | Chiu | 711/112 |
| 2013/0159607 A1* | 6/2013 | Kyung et al. | 711/103 |
| 2014/0115366 A1* | 4/2014 | Joo et al. | 713/323 |

* cited by examiner

*Primary Examiner* — Sheng-Jen Tsai
(74) *Attorney, Agent, or Firm* — Christie, Parker & Hale, LLP

(57) ABSTRACT

A system and method for storing infrequently accessed data with reduced power consumption. In one embodiment, a solid state drive (SSD) includes flash memory and environmental data logging circuitry. The SSD is shut off or operated in a sleep mode to reduce power consumption, and turned on or transitioned to an active mode as needed when data on the SSD is to be accessed, or when a calculation, based on a number of erase cycles previously performed in the flash memory and on a temperature history of the SSD indicates that a data refresh may be needed to prevent data corruption in the SSD, due to data retention limitation of the nonvolatile memory in the SSD.

17 Claims, 8 Drawing Sheets

POWER EFFICIENT METHOD FOR COLD STORAGE DATA RETENTION MANAGEMENT

FIELD

The following description relates to storage of infrequently accessed data and more particularly to a system and method of storing infrequently accessed data with low power consumption, e.g., with minimum power consumption.

BACKGROUND

Every day, several quintillion bytes of data may be created around the world. These data come from everywhere: posts to social media sites, digital pictures and videos, purchase transaction records, bank transactions, sensors used to gather data and intelligence, like weather information, cell phone GPS signal, and many others. This type of data and its vast accumulation is often referred to as "big data." This vast amount of data eventually is stored and maintained in storage nodes, such as hard disk drives (HDDs), solid-state storage drives (SSDs), or the like, and these may reside on networks or on storage accessible via the Internet, which may be referred to as the "cloud." In some cases the data is not accessed very frequently but it needs to be available at any time with minimal delay. For example, the data may be write once, read many (WORM) data, such as data posted to social media web sites, or video media posted by users on public video sharing sites.

Conventional storage solutions may not be well suited to this application. Hard disk drives, for example, may consume excessive power if kept spinning, and may take too long to start up if allowed to stop after each data access. Data corruption in solid state drives might be a consequence of very long periods of idle time. This limitation is sometimes referred to as a data retention limitation. Thus, there is a need for a system and method for storing large volumes of infrequently accessed data, providing rapid access, and in a power-efficient manner.

SUMMARY

In one embodiment of a system and method for storing infrequently accessed data with reduced power consumption, a solid state drive (SSD) includes flash memory and environmental data logging circuitry. The SSD is shut off or operated in a sleep mode to reduce power consumption, and turned on or transitioned to an active mode as needed when data on the SSD is to be accessed, or when a calculation, based on a number of erase cycles previously performed in the flash memory and on a temperature history of the SSD indicates that a data refresh may be needed to prevent data corruption in the SSD.

According to an embodiment of the present invention there is provided a method for operating a solid state drive (SSD) connected to a host, the SSD including nonvolatile memory and environmental data logging circuitry (EDLC) and a source of a battery power, the method including: requesting, by the host, a length of a first time interval from the SSD; providing, by the SSD, the length of the first time interval to the host; discontinuing, by the host, during the first time interval, a primary power supplied to the SSD; powering of the EDLC, by the SSD, from the source of the battery power during the first time interval; logging, by the EDLC, of environmental data; restoring, by the host, of the primary power supplied to the SSD; and refreshing of data stored in the SSD, by the SSD, when a module evaluated by the SSD indicates that, based on the logged environmental data, refreshing of the data is required.

In one embodiment, the environmental data includes a temperature of the SSD.

In one embodiment, the environmental data includes a time stamp.

In one embodiment, the method includes recording, by the SSD, a number of erase cycles performed on the nonvolatile memory.

In one embodiment, the providing, by the SSD, of the length of the first time interval to the host includes executing a remaining data life module.

In one embodiment, the remaining data life module is configured to accept as inputs a temperature history of the SSD since a most recent refresh, and a number of erase cycles previously performed on the nonvolatile memory.

According to an embodiment of the present invention there is provided a method for operating a solid state drive (SSD) connected to a host, the SSD comprising nonvolatile memory, the host including an environmental data logging system, the method including: requesting, by the host, a length of a first time interval from the SSD; providing, by the SSD, the length of the first time interval to the host; discontinuing, by the host, during the first time interval, a power supplied to the SSD; logging, by the environmental data logging system, of environmental data during the first interval; restoring, by the host, of the power supplied to the SSD; providing, by the host, logged environmental data to the SSD; and refreshing of data stored in the SSD, by the SSD, when a module evaluated by the SSD indicates that, based on the logged environmental data, refreshing of the data is required.

In one embodiment, the environmental data includes a temperature of the SSD.

In one embodiment, the environmental data includes a time stamp.

In one embodiment, the method includes recording, by the SSD, a number of erase cycles performed on the nonvolatile memory.

In one embodiment, the providing, by the SSD, the length of the first time interval to the host includes executing a remaining data life module.

In one embodiment, the remaining data life module is configured to accept as inputs a temperature history of the SSD since a most recent refresh, and a number of erase cycles previously performed on the nonvolatile memory.

According to an embodiment of the present invention there is provided a method for operating a solid state drive (SSD) connected to a host, the SSD including nonvolatile memory and environmental data logging circuitry (EDLC), the method including: instructing, by the host, the SSD to transition to a sleep mode; transitioning, by the SSD, to the sleep mode; logging, by the EDLC, of environmental data, while the SSD is in the sleep mode; instructing, by the host, the SSD to transition to an active mode; transitioning, by the SSD, to the active mode; refreshing of data stored in the SSD, by the SSD, when a module evaluated by the SSD indicates that, based on the logged environmental data, refreshing of the data is required; and sending, by the SSD, status information to the host.

In one embodiment, the environmental data includes a temperature of the SSD.

In one embodiment, the environmental data includes a time stamp.

In one embodiment, the method includes recording, by the SSD, a number of erase cycles performed on the nonvolatile memory.

In one embodiment, the module evaluated by the SSD is configured to accept as inputs a temperature history of the SSD since a most recent refresh, and a number of erase cycles previously performed on the nonvolatile memory.

BRIEF DESCRIPTION OF THE DRAWINGS

These and other features and advantages of the present invention will be appreciated and understood with reference to the specification, claims and appended drawings wherein:

DETAILED DESCRIPTION

The detailed description set forth below in connection with the appended drawings is intended as a description of exemplary embodiments of a power efficient method for cold storage data retention management provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
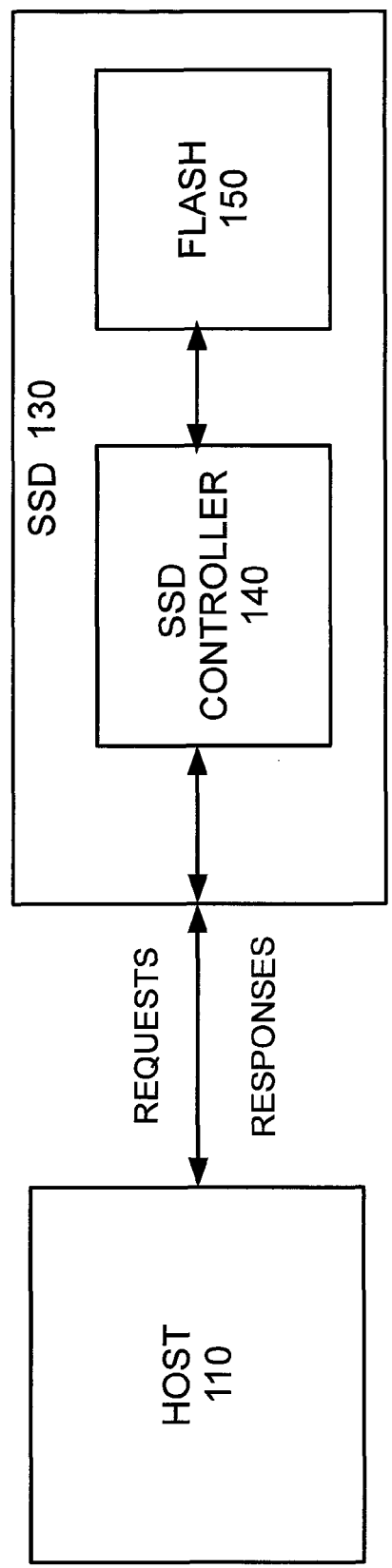
FIG. 1 is a block diagram of a host in communication with a solid state drive (SSD) according to an embodiment of the present invention.

In one embodiment, infrequently accessed data may be stored at low power consumption in storage facilities or storage devices referred to as cold storage. FIG. 1 is a block diagram of such a system according to one embodiment. The system of FIG. 1 includes a host 110 in communication with a storage node such as an SSD 130, which may include an SSD controller 140 and a non-volatile memory, e.g., a flash memory 150. The host 110 and the SSD 130 may communicate using any suitable interface such as Peripheral Component Interconnect Express (PCIe), and using any suitable protocol. FIG. 1 shows one host 110 in communication with an SSD 130, but the invention is not limited to this configuration. The invention may be employed, for example, in a system in which a host 110 is in communication with several SSDs 130, or with a combination of one or more SSDs 130 and one or more other storage devices such as HDDs, or the invention may be employed in a system with multiple hosts 110, each in communication with one or more storage devices.

Figure 2:
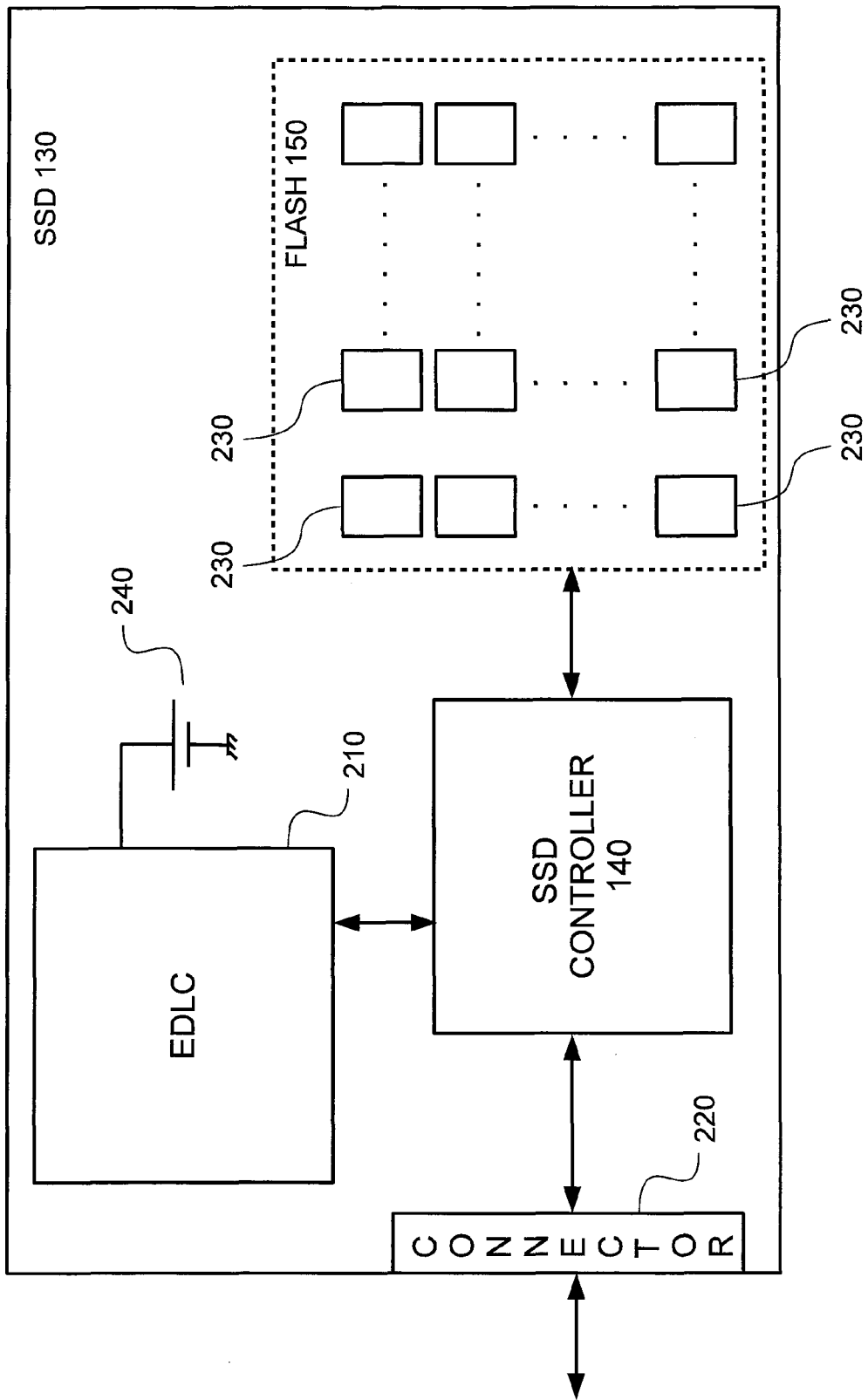
FIG. 2 is a block diagram of an SSD according to an embodiment of the present invention.

Referring to FIG. 2, an SSD suitable for cold storage may include an SSD controller 140 connected to flash memory 150, and an interface connector 220. The interface connector 220 may be used to connect the SSD 130 to a host 110. The flash memory may include several flash devices 230. Each flash device 230 may, for example, be an integrated circuit, and the flash devices 230 may be arranged in groups or in an array for purposes of addressing or for sharing communication channels with the SSD controller 140. For example the SSD controller may have several flash channel interfaces for communicating with the flash memory 150, and each flash channel interface may be shared by several flash devices 230. Each flash device 230 may include a number of blocks, and each block may include a number of pages of memory.

Data in the flash devices 230 in the SSD 130 may have a certain data life. As used herein, a data item refers to a quantity of data with a common data life, or remaining data life. A data item may be the data in a page or in a block of a flash device 230. When the age of a data item, which is measured from the time the data items is written to, or refreshed on, the flash device, exceeds the data life, the data item may be said to expire and the data may be corrupted or become unreliable. The data life may be different for different blocks or pages of the flash device 230, and it may depend on the number of program and erase cycles that have been performed on the block, and on the temperature history of the flash device. In particular, the data life of a block of the flash device 230 may be shortened with each program and erase cycle performed on the page or block. As used herein, the remaining data life of a data item is the data life of the data item less the age of the data item. Moreover, higher temperatures may shorten the data life, so that the remaining data life of a data item may be shortened if the flash device 230 is exposed to high temperatures after the data item is written. The finite data life of a data item on a flash device 230 is of particular importance in cold storage applications because the likelihood of a data item expiring is greater than in other applications in which the data are frequently refreshed by being re-written or overwritten with fresh data.

In one embodiment, a power efficient method for cold storage data retention management employs one of several approaches to estimate the remaining data life of data items stored in the SSD 130, and to refresh data on the SSD 130 before any of the data items expire. These approaches, may include configuring the SSD 130 to record the number of erase samples performed on each part of the flash memory 150. These approaches may also include a mechanism for monitoring environmental conditions, e.g., temperature. For example, and as illustrated in FIG. 2, the SSD 130 may include environmental data logging circuitry (EDLC) 210 for this purpose. The EDLC 210 may be connected to a battery 240 which may be its principal source of power or a secondary source of power.

Figure 3:
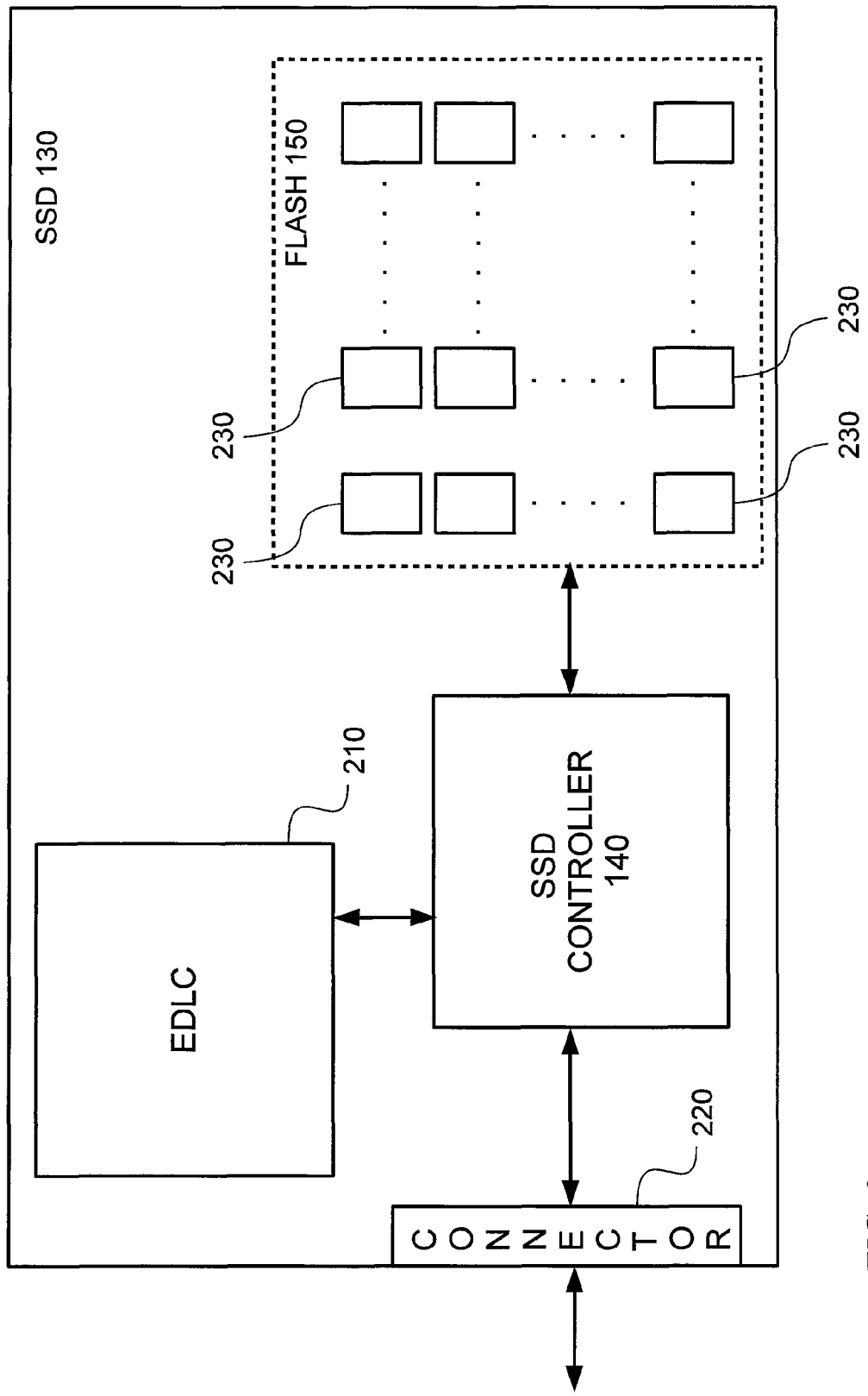
FIG. 3 is a block diagram of an SSD according to another embodiment of the present invention.

Referring to FIG. 3, in another embodiment, the EDLC battery 240 is absent, and the EDLC 210 is powered instead by external power, supplied, e.g. by the host 110, which powers the entire SSD 130. In one embodiment, the host 110 is configured to control the power to the SSD 130 and may shut off power to the SSD 130 during certain time intervals to reduce the power consumption of the system.

Figure 4:
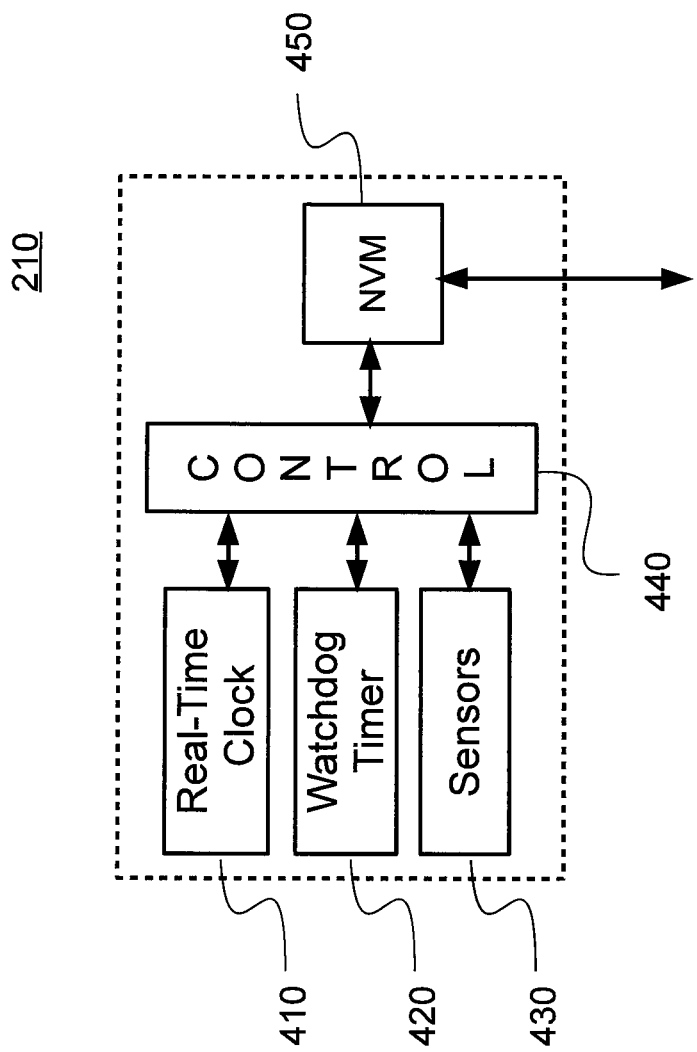
FIG. 4 is a block diagram of environmental data logging circuitry according to an embodiment of the present invention.

Referring to FIG. 4, the EDLC 210 may include a real-time clock 410, a watchdog timer 420, one or more sensors 430, an EDLC controller 440, and non-volatile memory (NVM) 450. In operation, the EDLC controller 440 may periodically read the sensors 430 and the real-time clock 410 and collect, e.g., record, time-tagged sensor readings, such as temperature readings, in the NVM 450. In other embodiments, the host 110 may contain an environmental data logging system, data logged by which may be used instead of, or in addition to, data logged by the EDLC 210, to determine when data items are nearing expiration. In one embodiment, the EDLC 210 may be integrated into the SSD controller 140 provided that it is implemented in a dedicated power island, so that power may be provided to the EDLC 210 without providing power to the entire SSD 130, which would result in excessive power consumption.

Figure 5:
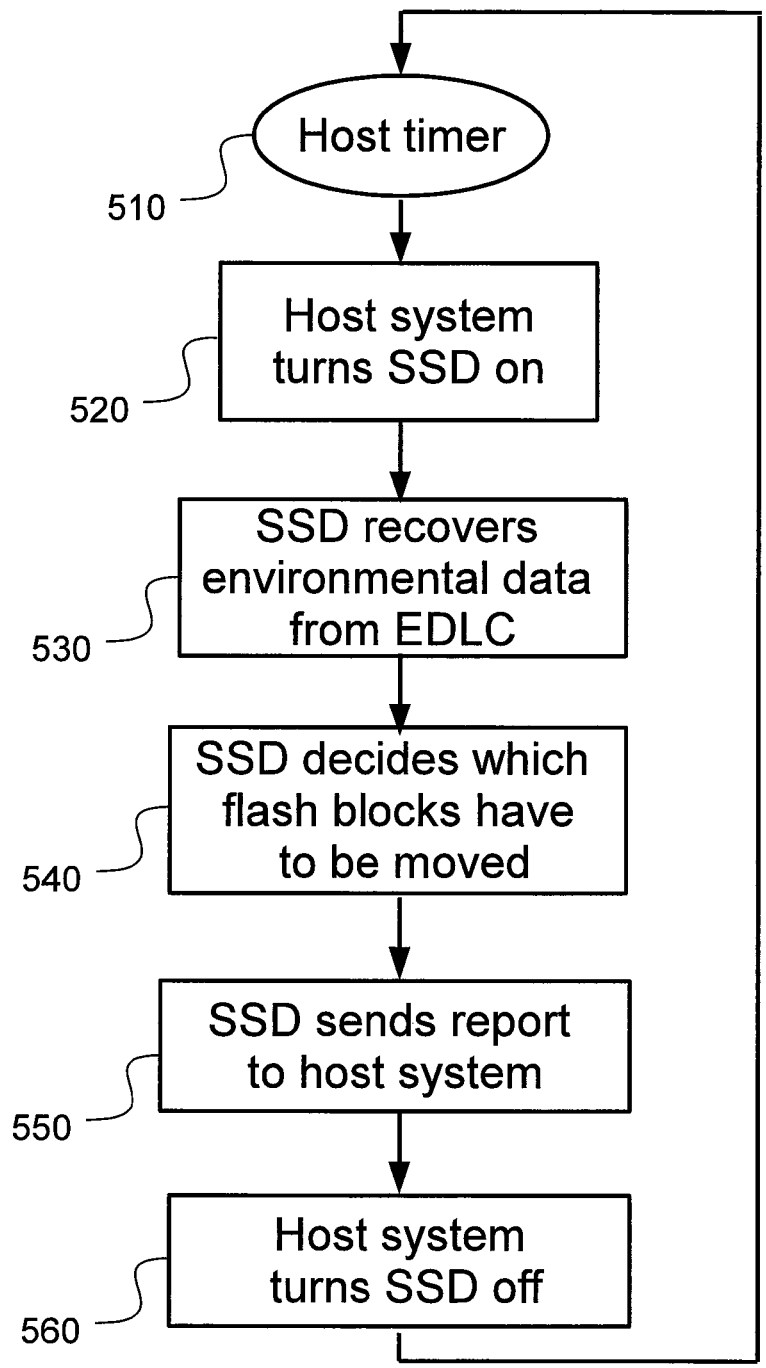
FIG. 5 is a flow chart of a method for operating a cold storage system according to an embodiment of the present invention.

Referring to FIG. 5, in one embodiment in which the EDLC 210 has, and is able to operate on power supplied from, a battery 240, avoiding expiration of data items is accomplished using the method illustrated, in which the host powers up the SSD 130 as needed to prevent expiration of data. In an act 510, the host operates a host timer until a set interval, referred to as a shutdown interval, has expired. During this time, external power to the SSD 130 is shut off by the host 110, and the EDLC 210, operating on battery power, logs time-stamped environmental data, e.g., temperature data, in non-volatile memory 450. In an act 520, the host 110 then turns on the SSD 130, i.e., turns on the power provided to the SSD 130. The SSD 130 starts up, and, in an act 530, the SSD 130 recovers time-stamped environmental data from the non-volatile memory 450 of the EDLC 210, and uses it, in an act 540, to identify the regions or portions of the flash devices 230 that need to be scanned and refreshed. If NAND flash is used, this process may be performed one flash block at a time. The SSD 130 then communicates, in an act 550, to the host 110 through vendor-specific commands the result of the analysis, including the next shutdown interval, e.g., an estimate of the time interval until a refresh may next be needed. This time interval may, for example, be the shortest expected remaining data life for any data item, under conservative assumptions for the temperature during the next shutdown interval, reduced by a certain amount to provide a safety margin. Finally, in an act 560 the host 110 shuts the SSD 130 off again, i.e., turns off power to the SSD 130, sets the host timer to the shutdown interval, and starts the host timer. If a need to access the data on the SSD 130 arises before the shutdown interval has ended, the host 110 may power up the SSD 130 briefly, to access the data, and then shut it down again.

Figure 6:
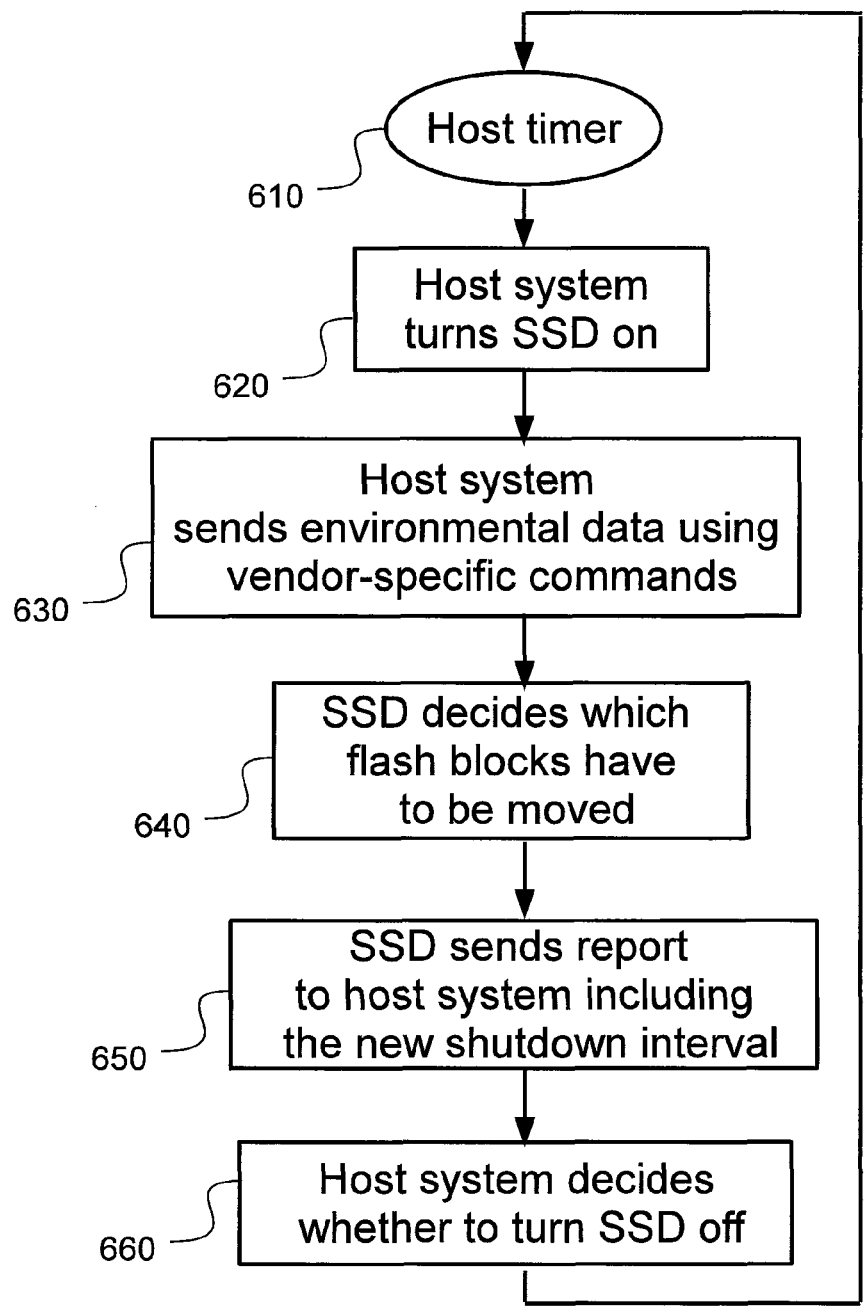
FIG. 6 is a flow chart of another method for operating a cold storage system according to an embodiment of the present invention.

Referring to FIG. 6, in another embodiment in which the EDLC 210 need not have a battery 240, avoiding expiration of data items is accomplished using the method illustrated, in which the host powers up the SSD 130 as needed to prevent expiration of data. In an act 610, the host operates a host timer until a set interval has expired. The host includes an environmental data logging system, and during the act 610, the host 110 collects relevant environmental information, e.g., the host 110 records the temperature along with a time stamp for each temperature sample, while the SSD 130 is powered down. In act 620, the host 110 then turns on the SSD 130, i.e., turns on the power provided to the SSD 130. The SSD 130 starts up, and, in an act 630, the host 110 provides the collected environmental data to the SSD 130. Any method may be used for sending the environmental data to the SSD 130, including but not limited to side band protocols such as Management Component Transport Protocol (MCTP), and vendor-specific commands. The SSD 130 receives the environmental data and uses it, to decide, in an act 640, which data items must be refreshed, e.g., moved. The SSD 130 then scans the flash devices 230 and refreshes the data as needed, based on the estimated remaining data life of the data items in the flash memory 150. If the flash memory is composed of NAND flash, then each data item may be a block, i.e., this process may be performed in units of blocks. In an act 650, the SSD 130 then sends to the host 110 a report including a new shutdown interval, and, in an act 660, the host 110 determines, based on the length of the new shutdown interval, whether to shut the SSD 130 off or leave it powered up.

Figure 7:
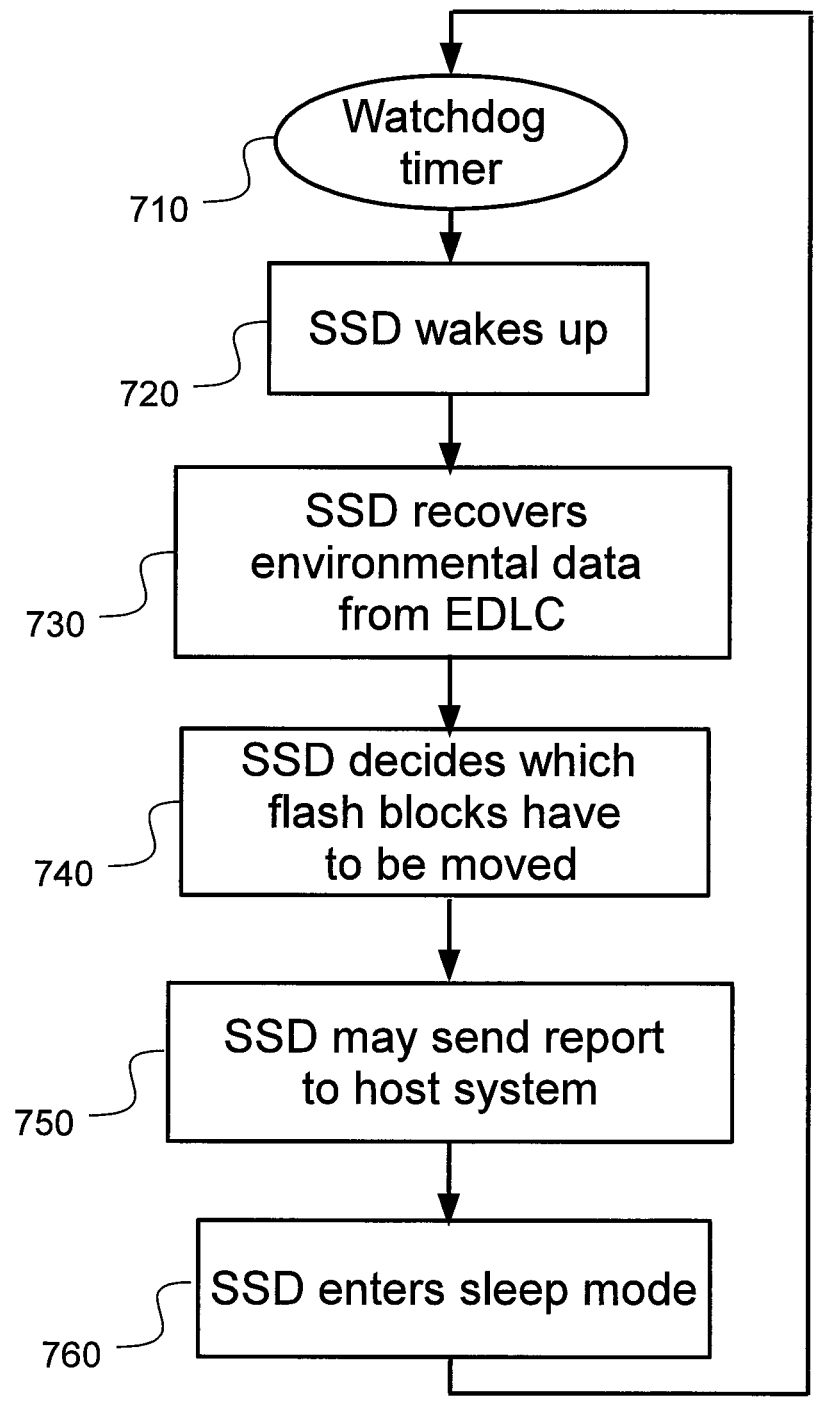
FIG. 7 is a flow chart of another method for operating a cold storage system according to an embodiment of the present invention.

Referring to FIG. 7, in another embodiment avoiding expiration of data items is accomplished using the method illustrated. In an act 710, the watchdog timer 420 in the EDLC 210 counts down, while the SSD 130 is in sleep mode, to the end of a certain time interval referred to herein as a sleep interval. During this time, the EDLC logs time-stamped environmental data, e.g., temperature data, in non-volatile memory 450. In sleep mode the host 110 continues to provide power to the SSD 130, but the SSD 130 disables all non-essential functions and operates in a reduced-functionality and reduced-power-consumption mode. In sleep mode the EDLC continues to operate, either from the power supplied by the host 110 or, if the EDLC 210 has, and is able to operate on power supplied from, a battery 240, then in sleep mode the EDLC may be powered by the battery 240. In an act 720, when the watchdog timer 420 has expired, i.e., reached the end of the sleep interval, the SSD 130 wakes up, i.e., switches to an active mode. In an act 730, the SSD 130 recovers time-stamped environmental data from the non-volatile memory 450 of the EDLC 210, and uses it, in an act 740, to decide which regions or portions of the flash devices 230 need to be scanned and refreshed, e.g., moved. If NAND flash is used, this process may be performed one flash block at a time. The SSD 130 then scans the flash devices 230 and refreshes the data as needed, based on the estimated remaining data life of the data items in the flash memory 150. The SSD 130 then optionally communicates, in an act 750, to the host 110, through vendor-specific commands, the results of the analysis and a report containing, e.g., a list of blocks that were moved. Finally, in an act 760 the SSD 130 sets the watchdog timer 420 to a new sleep interval and enters sleep mode. This may be accomplished by firmware running in the SSD 130, or by the operating system of the SSD 130, if it is configured with one. The sleep time interval may, for example, be the shortest expected remaining data life for any data item, under conservative assumptions for the temperature during the next sleep interval, reduced by a certain amount to provide a safety margin.

Figure 8:
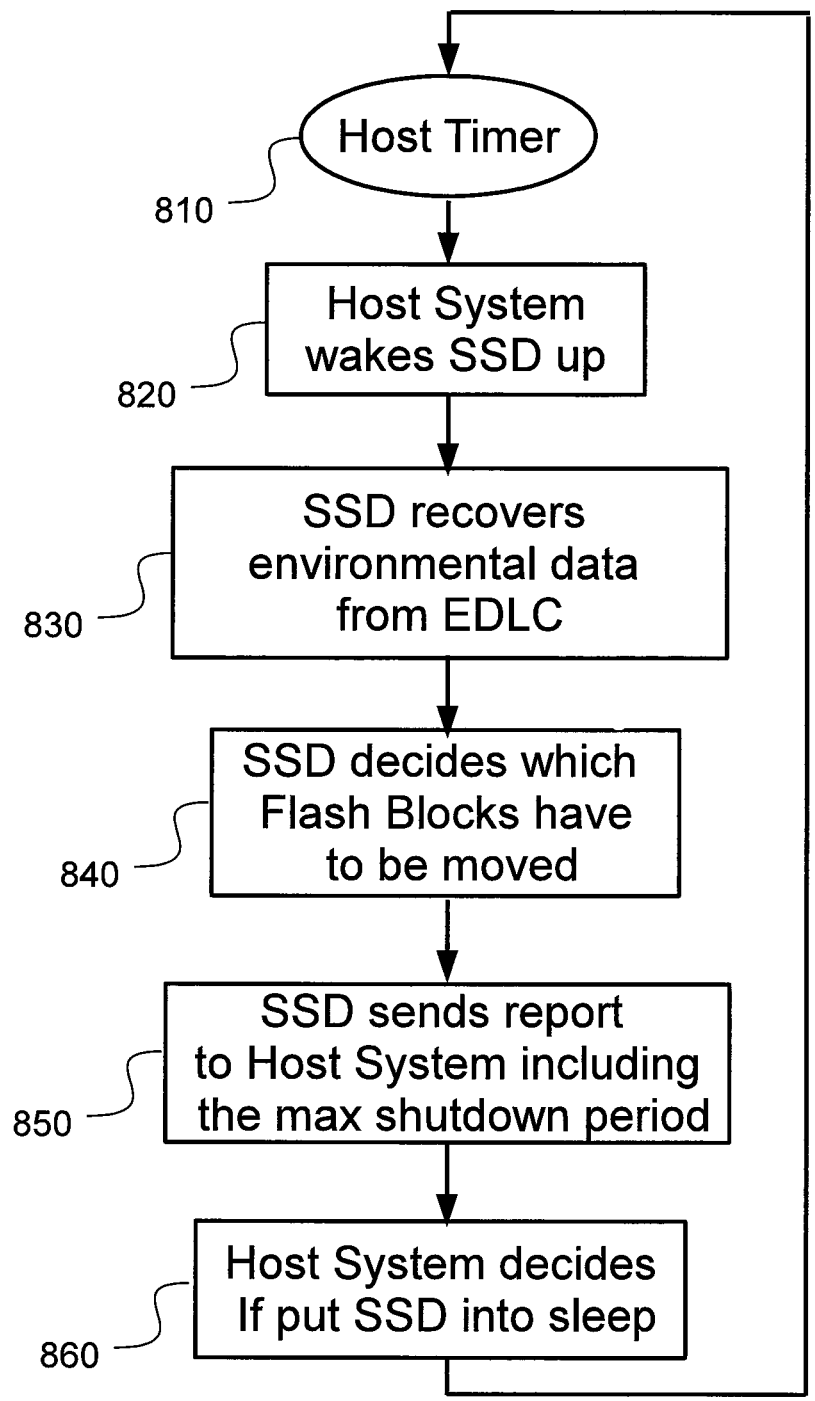
FIG. 8 is a flow chart of another method for operating a cold storage system according to an embodiment of the present invention.

Referring to FIG. 8, in another embodiment, avoiding expiration of data items is accomplished using the method illustrated. In an act 810, a host timer counts down, while the SSD 130 is in sleep mode, to the end of a sleep interval. During this time, the EDLC logs time-stamped environmental data, e.g., temperature data, in non-volatile memory 450. In sleep mode the host 110 continues to provide power to the SSD 130, but the SSD 130 disables all non-essential functions and operates in a reduced-functionality and reduced-power-consumption mode. In sleep mode the EDLC continues to operate, either from the power supplied by the host 110 or, if the EDLC 210 has, and is able to operate on power supplied from, a battery 240, then in sleep mode the EDLC may be powered by the battery 240. In an act 820, when the host timer has expired, i.e., reached the end of the sleep interval, the host wakes the SSD 130 up, i.e., causes the SSD 130 to switch to an active mode. In an act 830, the SSD 130 recovers time-stamped environmental data from the non-volatile memory 450 of the EDLC 210, and uses it, in an act 840, to decide which regions or portions of the flash devices 230 need to be scanned and refreshed, e.g., moved. If NAND flash is used, this process may be performed one flash block at a time. The SSD 130 then scans the flash devices 230 and refreshes the data as needed, based on the estimated remaining data life of the data items in the flash memory 150. The SSD 130 then sends to the host 110, in an act 850, a report including a new sleep interval. Finally, in an act 860 the host 110 determines, based on the length of the new sleep interval, whether to cause the SSD 130 to transition to sleep mode or to leave it in active mode.

In each of the methods of FIGS. 5-8, a software or firmware module may be executed to estimate the remaining data life of any data item, based on the number of erase cycles previously performed on the area of flash memory 150 in which the data item resides, on the temperature history the SSD 130 has experienced since the initial writing or most recent refresh of the data item, and the temperature the SSD is expected to experience during the remaining data life of the data item. This module may be referred to as a remaining data life module. Because the true remaining data life of a data item is not susceptible of precise calculation, the module may optionally reduce the estimated remaining data life so as to provide margin in the estimated remaining data life, and so that the likelihood of data corruption is acceptably low if the data item is refreshed prior to the expiration of the reduced estimated remaining data life. The remaining data life module may be executed on the host 110 or on the SSD 130.

Although exemplary embodiments of a power efficient method for cold storage data retention management have been specifically described and illustrated herein, many modifications and variations will be apparent to those skilled in the art. Accordingly, it is to be understood that a power efficient method for cold storage data retention management constructed according to principles of this invention may be embodied other than as specifically described herein. The invention is also defined in the following claims, and equivalents thereof.

What is claimed is:

1. A method for operating a solid state drive (SSD) connected to a host, the SSD comprising nonvolatile memory and environmental data logging circuitry (EDLC) and a source of a battery power, the method comprising:
   requesting, by the host, a length of a first time interval from the SSD;
   providing, by the SSD, the length of the first time interval to the host;
   discontinuing, by the host, during the first time interval, a primary power supplied to the SSD;
   powering of the EDLC, by the SSD, from the source of the battery power during the first time interval;
   logging, by the EDLC, of environmental data at a plurality of points in time;
   restoring, by the host, of the primary power supplied to the SSD, at the end of the first time interval; and
   refreshing of data stored in the SSD, by the SSD, when a module evaluated by the SSD indicates that, based on the logged environmental data, refreshing of the data is required.

2. The method of claim 1, wherein the environmental data comprises a temperature of the SSD.

3. The method of claim 2, wherein the environmental data comprises a time stamp.

4. The method of claim 1, comprising recording, by the SSD, a number of erase cycles performed on the nonvolatile memory.

5. The method of claim 1, wherein the providing, by the SSD, of the length of the first time interval to the host comprises executing a remaining data life module.

6. The method of claim 5, wherein the remaining data life module is configured to accept as inputs a temperature history of the SSD since a most recent refresh, and a number of erase cycles previously performed on the nonvolatile memory.

7. A method for operating a solid state drive (SSD) connected to a host, the SSD comprising nonvolatile memory, the host comprising an environmental data logging system, the method comprising:
   requesting, by the host, a length of a first time interval from the SSD;
   providing, by the SSD, the length of the first time interval to the host;
   discontinuing, by the host, during the first time interval, a power supplied to the SSD;
   logging, by the environmental data logging system, of environmental data at a plurality of points in time during the first interval;
   restoring, by the host, of the power supplied to the SSD, at the end of the first time interval;
   providing, by the host, logged environmental data to the SSD; and
   refreshing of data stored in the SSD, by the SSD, when a module evaluated by the SSD indicates that, based on the logged environmental data, refreshing of the data is required.

8. The method of claim 7, wherein the environmental data comprises a temperature of the SSD.

9. The method of claim 8, wherein the environmental data comprises a time stamp.

10. The method of claim 7, comprising recording, by the SSD, a number of erase cycles performed on the nonvolatile memory.

11. The method of claim 7, wherein the providing, by the SSD, the length of the first time interval to the host comprises executing a remaining data life module.

12. The method of claim 11, wherein the remaining data life module is configured to accept as inputs a temperature history of the SSD since a most recent refresh, and a number of erase cycles previously performed on the nonvolatile memory.

13. A method for operating a solid state drive (SSD) connected to a host, the SSD comprising nonvolatile memory and environmental data logging circuitry (EDLC), the method comprising:
   instructing, by the host, the SSD to transition to a sleep mode;
   transitioning, by the SSD, to the sleep mode;
   logging, by the EDLC, of environmental data at a plurality of points in time, while the SSD is in the sleep mode;
   instructing, by the host, the SSD to transition to an active mode;
   transitioning, by the SSD, to the active mode;
   refreshing of data stored in the SSD, by the SSD, when a module evaluated by the SSD indicates that, based on the logged environmental data, refreshing of the data is required; and
   sending, by the SSD, status information to the host, wherein the status information comprises a new sleep interval.

14. The method of claim 13, wherein the environmental data comprises a temperature of the SSD.

15. The method of claim 14, wherein the environmental data comprises a time stamp.

16. The method of claim 13, comprising recording, by the SSD, a number of erase cycles performed on the nonvolatile memory.

17. The method of claim 13, wherein the module evaluated by the SSD is configured to accept as inputs a temperature history of the SSD since a most recent refresh, and a number of erase cycles previously performed on the nonvolatile memory.

\* \* \* \* \*